United States Patent
Kashiwagi (10) Patent No.: US 11,275,400 B2
(45) Date of Patent: Mar. 15, 2022

(54) DATA TRANSMISSION APPARATUS AND DATA TRANSMISSION METHOD

(71) Applicant: KIOXIA CORPORATION, Tokyo (JP)

(72) Inventor: Yoshiki Kashiwagi, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 74 days.

(21) Appl. No.: 16/553,753

(22) Filed: Aug. 28, 2019

(65) Prior Publication Data

US 2020/0301466 A1 Sep. 24, 2020

(30) Foreign Application Priority Data

Mar. 20, 2019 (JP) .............................. JP2019-053168

(51) Int. Cl.
| | | |
|---|---|---|
| *G06F 1/08* | (2006.01) | |
| *G01R 31/317* | (2006.01) | |
| *G06F 1/14* | (2006.01) | |
| *G06F 1/12* | (2006.01) | |
| *G06F 1/10* | (2006.01) | |

(52) U.S. Cl.
CPC .......... *G06F 1/08* (2013.01); *G01R 31/31726* (2013.01); *G06F 1/10* (2013.01); *G06F 1/12* (2013.01); *G06F 1/14* (2013.01)

(58) Field of Classification Search
CPC ..................................... G06F 1/08; G06F 1/14
See application file for complete search history.

(56) References Cited

U.S. PATENT DOCUMENTS

| | | | |
|---|---|---|---|
| 7,466,723 B2 * | 12/2008 | Vakil .......................... | G06F 1/10 326/21 |
| 8,817,929 B2 | 8/2014 | Shimomura | |
| 9,548,858 B1 * | 1/2017 | Cirit ......................... | H04L 7/033 |
| 10,333,571 B1 * | 6/2019 | Chang ...................... | H04L 25/14 |
| 2005/0005051 A1 * | 1/2005 | Tseng ..................... | G06F 13/385 710/310 |
| 2005/0195928 A1 | 9/2005 | Yamazaki | |
| 2009/0276559 A1 * | 11/2009 | Allen, Jr. ............ | G06F 13/1684 711/5 |
| 2011/0246810 A1 * | 10/2011 | Wessel ...................... | G06F 1/04 713/501 |

(Continued)

FOREIGN PATENT DOCUMENTS

JP 2013-152548 A 8/2013

*Primary Examiner* — Phil K Nguyen
(74) *Attorney, Agent, or Firm* — Foley & Lardner LLP (57) ABSTRACT

A data transmission apparatus includes lanes, a first clock generation circuit, a second clock generation circuit, a first circuit, and a second circuit. The first clock generation circuit can generate a first clock as a reference for data transmission in a first lane. The second clock generation circuit can generate a second clock as a reference for data transmission in a second lane. The first circuit can determine a shift amount by notification of a first delay amount of the first lane and a second delay amount of the second lane to cause a delay amount of one of the first clock and the second clock to match a delay amount of the other of the first clock and the second clock. The second circuit can shift the first delay amount or the second delay amount based on the determined shift amount.

9 Claims, 8 Drawing Sheets

(56) References Cited

U.S. PATENT DOCUMENTS

| | | | |
|---|---|---|---|
| 2012/0251099 A1* | 10/2012 | Khatana | H04J 3/047 398/16 |
| 2017/0046298 A1* | 2/2017 | Yu | G06F 13/4226 |
| 2018/0343151 A1* | 11/2018 | Tiruvur | H04L 27/04 |
| 2019/0121758 A1* | 4/2019 | Lawson | G06F 1/10 |
| 2019/0273571 A1* | 9/2019 | Bordogna | H04L 1/0057 |

* cited by examiner

DATA TRANSMISSION APPARATUS AND DATA TRANSMISSION METHOD

CROSS-REFERENCE TO RELATED APPLICATION

This application is based upon and claims the benefit of priority from Japanese Patent Application No. 2019-053168, filed Mar. 20, 2019, the entire contents of which are incorporated herein by reference.

FIELD

Embodiments described herein relate generally to a data transmission apparatus and a data transmission method for performing data transmission based on, for example, an interface standard such as PCI Express (registered trademark).

BACKGROUND

In data transmission conforming to the PCI Express standard, the need for a function called "Bifurcation" in which the number of lanes constituting a link varies depending on a configuration and application of a connected device is increasing.

In a data transmission apparatus having the Bifurcation function, in order to enable each lane to communicate at a different data rate (transmission rate), an independent clock frequency divider circuit is provided for each lane.

When the independent clock frequency divider circuit is provided for each lane, for frequency-divided clocks output by each clock frequency divider circuit, clock skew (timing difference) between lanes, so-called an inter-lane skew, occur in a circuit on a reception side.

In the circuit on the reception side having a plurality of lanes, when data is latched using frequency-divided clocks in each lane, the data latch timing differs for each lane due to the inter-lane skew. For that reason, if the difference in latch timing between lanes becomes large, data transmission performance may be affected.

With the expectation that a specification will have stricter requirements as the data rate increases, it is desirable to eliminate the influence of clock skew between the lanes.

DETAILED DESCRIPTION

Embodiments provide a data transmission apparatus and a data transmission method capable of appropriately transmitting data in a link configured with a plurality of lanes.

In general, according to one embodiment, there is provided a data transmission apparatus including a plurality of lanes each providing a transmission path, a first clock generation circuit configured to generate a first clock as a reference for data transmission in a first lane of the plurality of lanes, and a second clock generation circuit configured to generate a second clock as a reference for data transmission in a second lane of the plurality of lanes. The first and second lanes are configured to constitute a part of a link as a unit of data transmission. The data transmission apparatus includes a first circuit, and a second circuit. The first circuit is configured to determine a shift amount by notification of a first delay amount of the first lane and a second delay amount of the second lane to cause a delay amount of one of the first clock and the second clock to match a delay amount of the other of the first clock and the second clock. The second circuit is configured to shift the first delay amount or the second delay amount based on the determined shift amount.

Hereinafter, embodiments will be described in detail with reference to the drawings. The drawings indicated below are examples, and the embodiments are not limited to these configurations.

Figure 1:
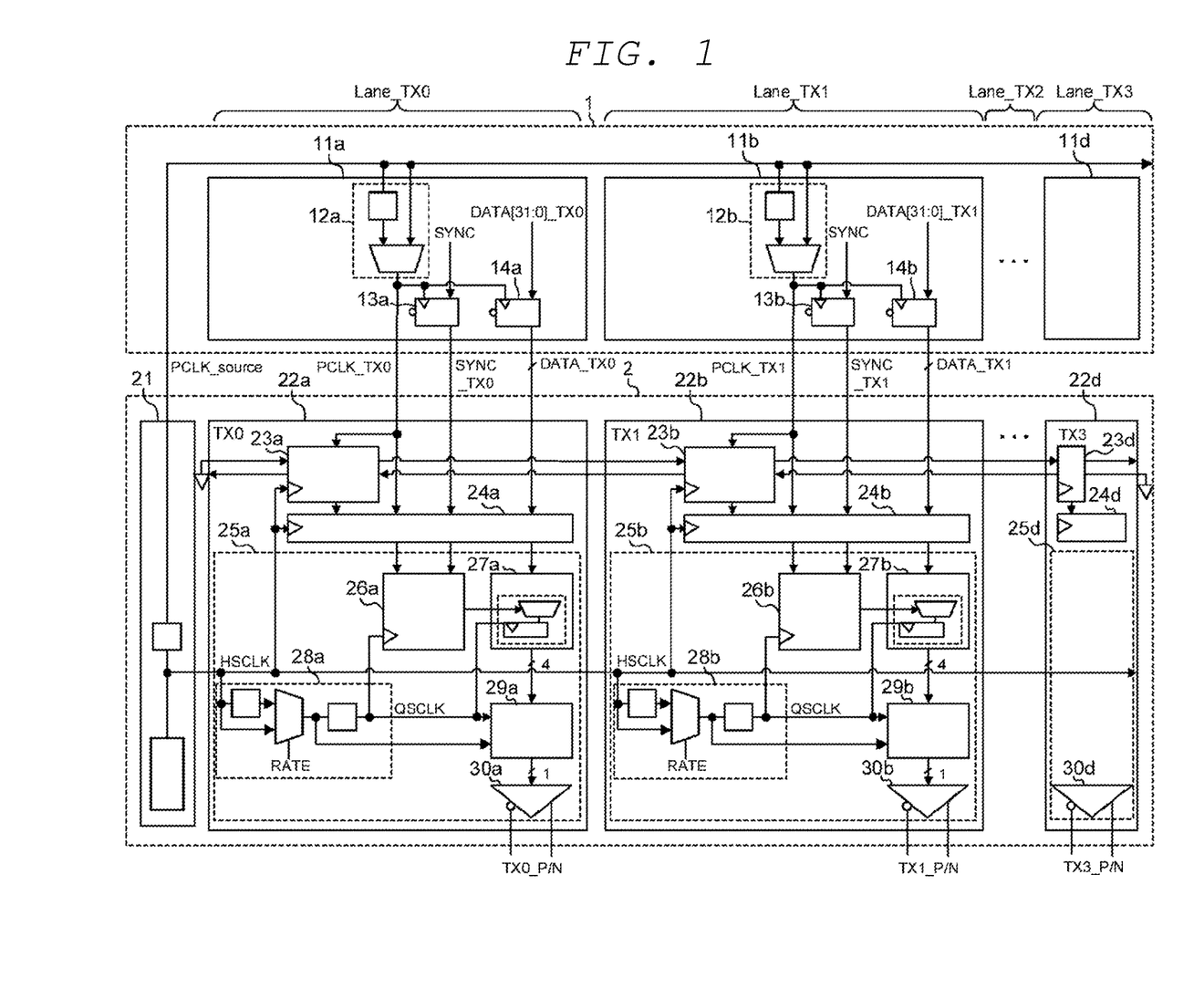
FIG. 1 is a diagram illustrating a schematic configuration of a data transmission apparatus according to an embodiment.

FIG. 1 is a diagram illustrating a schematic configuration of a data transmission apparatus according to an embodiment.

The data transmission apparatus of the embodiment is an interface device including a transmission circuit for transmitting data and a reception circuit for receiving data in conformity with a standard such as PCI Express, for example. In the embodiment, mainly, a configuration and operation of the transmission circuit will be described.

As illustrated in FIG. 1, the transmission circuit of the data transmission apparatus of the embodiment has four lanes including Lane_TX0 as a first lane, Lane_TX1 as a second lane, Lane_TX2 as a third lane, and Lane_TX3 as a fourth lane. The lane is a data transmission path including a plurality of signal lines.

In the data transmission apparatus of the embodiment, the Bifurcation function is supported, one link is configured with a predetermined number of lanes of a plurality of lanes, and parallel data is converted into serial data through each lane for each link to output the serial data. The number of lanes constituting one link is variable. For example, for a data transmission apparatus having four lanes, it is possible to use a configuration of 4 lanes×1 link as a configuration of 2 lanes×2 links.

The data transmission apparatus of the embodiment has a plurality of (e.g., four) Lane_TX0 to Lane_TX3 as data transmission paths. One or more lanes out of Lane_TX0 to Lane_TX3 constitute a link as a transmission unit, and data transmission is possible at a transmission rate specified for each link. For example, two lanes (Lane_TX0 and Lane_TX1) of the plurality of Lane_TX0 to Lane_TX3 constitute a link as a transmission unit, and data transmission is possible at the transmission rate specified in the link.

In the embodiment, an example in which one link is configured with four lanes is described, but, the number of lanes and the number of links are not limited to this example. For example, in a data transmission apparatus provided with 8 lanes, various combinations may be made such as a configuration of 4 lanes×2 links, 8 lanes×1 link, 2 lanes×4 links, or 1 lane×4 links.

The data transmission apparatus is configured with a first circuit group 1 and a second circuit group 2. The first circuit group 1 is a circuit part in which a circuit is automatically designed based on various parameters in a computer. The second circuit group 2 is a circuit part implemented by incorporating real circuit elements. The first circuit group 1 includes frequency divider circuits 11a to 11d for each lane.

The frequency divider circuit 11a as a first clock generation circuit includes a clock frequency divider circuit 12a including a divider and a selector, and latch circuits 13a and 14a. The clock frequency divider circuit 12a outputs PCLK_TX0 obtained by dividing PCLK_source which is a source clock. The latch circuit 13a outputs a signal SYNC_TX0 obtained by latching a synchronization signal SYNC with PCLK_TX0. The latch circuit 14a outputs 32-bit parallel data DATA_TX0 obtained by latching 32-bit data DATA[31:0] TX0 of data 0 to data 31 with PCLK_TX0, respectively.

In this example, the number of bits of the parallel data is 32. However, the embodiment is not limited to the number of bits. For example, 16 bits or 64 bits may be used for the number of bits.

That is, the frequency divider circuit 11a is provided in Lane_TX0, generates PCLK_TX0, which is the first clock, by dividing PCLK_source, and outputs the generated PCLK_TX0 to the parallel-to-serial conversion circuit 22a provided in the second circuit group 2 corresponding to Lane_TX0, together with SYNC_TX0 and DATA_TX0.

The frequency divider circuit 11b as a first clock generation circuit includes a clock frequency divider circuit 12b including a divider and a selector, and latch circuits 13b and 14b. The clock frequency divider circuit 12b outputs PCLK_TX1 obtained by dividing PCLK_source. The latch circuit 13b outputs a signal SYNC_TX1 obtained by latching the synchronization signal SYNC with PCLK_TX1. The latch circuit 14b outputs 32-bit parallel data DATA_TX1 obtained by latching DATA[31:0] TX1 with PCLK_TX1, respectively.

Similarly to the frequency divider circuit 11a, the parallel data can be used with various bit numbers.

That is, the frequency divider circuit 11b is provided in Lane_TX1, generates PCLK_TX1, which is the second clock, by dividing PCLK_source which is branched and input, and outputs the generated PCLK_TX1 to the parallel-to-serial conversion circuit 22b provided in the second circuit group 2 corresponding to Lane_TX1, together with SYNC_TX1 and DATA_TX1. The other frequency divider circuits 11c and 11d have the same configuration, and the individual description thereof will be omitted.

The second circuit group 2 includes a reference clock generation circuit (COM) 21 for generating PCLK_source as the source clock branched and supplied to each lane, and parallel-to-serial conversion circuits 22a to 22d provided for the lanes Lane_TX0 to Lane_TX3, respectively. As will be described in detail below, the parallel-to-serial conversion circuits 22a to 22d cooperate with one another to thereby reduce the difference in the clock skew between four Lane_TX0 to Lane_TX3.

The inter-lane clock skew is defined as follows. The inter-lane clock skew is the difference (difference) in the delay amount (see FIG. 7) of each PCLK_TXn from a certain reference time (for example, the timing when PCLK source is output from COM 21 common to the lanes) until each PCLK_TXn is branched to each lane and received by the second circuit group 2 on the reception side. Thereafter, the inter-lane clock skew may be referred to simply as a skew.

The parallel-to-serial conversion circuits 22a to 22d are the circuits provided in Lane_TX0 to Lane_TX3, respectively. Further, the parallel-to-serial conversion circuits 22a to 22d include shift calculation circuits (Shift Calc) 23a to 23d as a first circuit that determines a shift amount of PCLK_TXn, data shift circuits (Data Shift) 24a to 24d as a second circuit that shifts PCLK_TXn and DATA_TXn, Parallel-in Serial-out circuits (PISO) 25a to 25d as a parallel-to-serial conversion circuit, respectively. Regarding TXn, n is an integer starting from 0, and this example has a 4 lane configuration and thus numbers from 0 to 3 are used.

As such, each of Shift Calc 23a to 23d, Data Shift 24a to 24d, and PISO 25a to 25d is provided for each of Lane_TX0 to Lane_TX3. For example, Lane_TX0 includes Shift Calc 23a which is a first shift calculation circuit, Data Shift 24a which is a first data shift circuit, and the PISO 25a which is the first conversion circuit. The same applies to the other Lane_TX1 to Lane_TX3.

The COM 21 includes a PLL circuit and a frequency divider circuit, generates PCLK_source to be the source clock, and branches the generated PCLK_source to the frequency divider circuits 11a to 11d of the first circuit group 1 and supplies the generated PCLK_source to the frequency divider circuits 11a to 11d.

Regarding Parallel-to-Serial Conversion Circuit 22a (Lane_TX0: First Lane)

In the illustrated embodiment of FIG. 1, Lane_TX0 (first lane) is a lane with no lane connected to the left side and thus, operations of Lane_TX1 (second lane) to Lane_TX3 (fourth lane) to which a lane is connected on the left side are main operations. For that reason, details thereof will be described in detail in the description of the parallel-to-serial conversion circuit 22b of Lane_TX1 (second lane) below. The matters that Lane_TX0 (first lane) has no lane connected on its left side may be achieved, for example, by setting a signal input from a lane on the left side to Shift Calc 23a to a predetermined level (for example, ground level). In FIG. 1, when information is transmitted from a lane on the right side to a lane on the left side, each configuration in Lane_TX0 (first lane) performs the same operation as each configuration of other lanes.

Shift Calc 23a of Lane_TX0 calculates a delay amount of PCLK_TX0 input from the frequency divider circuit 11a and notifies Lane_TX1 (second lane) adjacent to the right side in FIG. 1 of the calculated delay amount.

Shift Calc 23a of Lane_TX0 and Shift Calc 23b of Lane_TX1 adjacent to each other are connected in a daisy chain, and delivery of information between lanes (transfer of delay amount and skew value between adjacent lanes, feedback of the maximum skew value, and the like) is performed. In this embodiment, a Shift Calc of Lane_TX2 and Shift Calc 23d of Lane_TX3 are similarly connected in a daisy chain, and delivery of information between 4 lanes is performed. The directions of delivery of information between lanes connected in a daisy chain are defined as upstream and downstream. Transmission of skew values between adjacent lanes is performed from upstream to downstream. Thereafter, feedback of the maximum skew value is returned from downstream to upstream.

In the data transmission apparatus of the present embodiment, one of the lanes among Lane_TX0 to Lane_TX3 is set as a master lane by a selector 31 (see FIG. 2) as will be described later. In the embodiment, an example in which Lane_TX0 is set to the master lane, Lane_TX1, Lane_TX2, and Lane_TX3 are set to slave lane, and especially Lane_TX3 is set to a slave end lane will be described. For that reason, the circuit configuration of each lane is the same, but the operation thereof is different.

For example, Shift Calc 23a of Lane_TX0 set as the master lane functions as a circuit for acquiring the delay amount (the most retarded drift position) of PCLK of lane (for example, Lane_TX2 and the like) which is most retarded in phase among PCLK_TX0 to TX3, based on the clock skew of PCLK between adjacent lanes calculated by each of Lane_TX0 to Lane_TX3. The detailed circuit configuration for realizing this function will be described with reference to FIG. 2.

Data Shift 24a is an example of the first data shift circuit. Data Shift 24a delays (corrects) an output timing of a pulse of PCLK_TX0 to match the latest drift position obtained by Shift Calc 23a and also determines the shift amount of each parallel data DATA_TX0 so as to load the parallel data DATA_TX0 input from the frequency divider circuit 11a at the output timing of the pulse of the corrected PCLK_TX0. The pulse is also referred to as a clock bit.

PISO 25a includes a parallel data read circuit (PISO_LOAD) 26a, a data conversion circuit (PISO_n_to_4) 27a, a frequency divider circuit 28a, a P-to-S conversion circuit (PISO_4_to_1) 29a, and an output circuit 30a. PISO_LOAD 26a reads the parallel data input from the frequency divider circuit 11a. PISO_n_to_4 27a stores n-bit (here, 32-bit) parallel data read by the PISO_LOAD 26a and outputs 4-bit parallel data.

The frequency divider circuit 28a divides a frequency of HSCLK input from the PLL circuit of the COM 21 by 4 to generate a ¼ frequency-divided clock (QSCLK). PISO_4_to_1 29a converts the 4-bit parallel data input from the PISO_n_to_4 27a to 1-bit serial data using QSCLK. The output circuit 30a outputs differential data TX0_P/N based on the serial data converted by the PISO_4_to_1 29a.

PISO_LOAD 26a generates a PISO_Load signal based on a rise edge of PCLK_TK0 and outputs the PISO_Load signal to the PISO_n_to_4 27a. PISO_n_to_4 27a includes a shift register. In this example, 32-bit parallel data is once converted into 4-bit parallel data by the PISO_n_to_4 27a and then converted into 1-bit serial data by the PISO_4_to_1 29a, but 32-bit parallel data may be converted into one-bit serial data at a time.

That is, the PISO 25a loads the 32-bit parallel data DATA_TX0 input from the divider circuit 11a at the timing shifted by Data Shift 24a, converts the loaded parallel data DATA_TX0 into 1-bit serial data, and outputs differential data TK0_P/N based on the converted serial data.

Regarding Parallel-to-Serial Conversion Circuit 22b (Lane_TX1: Second Lane)

For example, for two lanes of Lane_TX0 and Lane_TX1, Shift Calc 23b determines the shift amount of the clock such that the delay amount of one clock (PCLK) of PCLK_TX0 and PCLK_TX1 matches the delay amount of the other clock by allowing circuit elements to notify each other of information on the clock skew including the delay amount of PCLK_TX0 and information on the clock skew including the delay amount of PCLK_TX1. The information on the clock skew includes a value of the delay amount, a difference value, and the maximum difference value obtained in a measurement procedure illustrated in FIG. 8.

Specifically, based on the delay amount of PCLK_TX0 notified from Lane_TX0 and the delay amount of PCLK_TX1 of own Lane_TX1, Shift calc 23b detects the rise edge (rising position or drift position of the clock bit) of the PCLK pulse of one of Lane_TX0 and Lane_TX1, which is behind the other in phase, and determines the shift amount of PCLK that matches the detected rise edge. Specifically, the shift amount (drift amount) for shifting (drifting) PCLK of the other of Lane_TX0 and Lane_TX1 is determined so as to match the phase of one PCLK that is retarded in timing of the rise edge of the pulse of PCLK.

In other words, in Lane_TX1, Shift Calc 23b calculates the delay amount of PCLK_TX1 input from frequency divider circuit 11b and calculates the difference between the calculated delay amount of PCLK_TX1 and the delay amount of PCLK_TX0 obtained from the adjacent Lane_TX0 (first lane). Shift Calc 23b detects the drift position of PCLK (pulse) of one of Lane_TX0 and Lane_TX1, which is behind the other in phase based on the difference in the calculated delay amount and determines the shift amount of PCLK matched to the detected drift position.

Data Shift24b is an example of a second data shift circuit configured similarly to Data Shift 24a of Lane_TX0. Data Shift 24b delays (corrects) an output timing of a pulse of PCLK_TX1 to match the slowest drift position obtained by Shift Calc 23b and also determines the shift amount of each parallel data DATA_TX1 so as to load the parallel data DATA_TX1 input from the frequency divider circuit 11b at the output timing of the pulse of the corrected PCLK_TX1.

PISO 25b is a second conversion circuit including a configuration (PISO_LOAD 26b, PISO_n_to_4 27b, frequency division circuit 28b, and PISO_4_to_1 29b) similar to the PISO 25a of Lane_TX0. PISO 25b loads 32-bit parallel data DATA_TX1 input from the frequency divider circuit 11b at the timing shifted by Data Shift 24b, converts the loaded parallel data DATA_TX1 into 1-bit serial data, and outputs a differential data TX1_P/N based on the converted serial data. The same circuit configuration is also applied to Lane_TX2 (third lane) and Lane_TX3 (fourth lane), and thus individual descriptions thereof will be omitted.

Here, the detailed circuit configuration of Shift Calc 23a to 23d will be described with reference to FIG. 2. In this example, Shift Calc 23a is the master lane (specific lane) and Shift Calc 23b to 23d are the slave lanes and thus, typically, Shift Calc 23b which is one of the slave lanes will be described.

Figure 2:
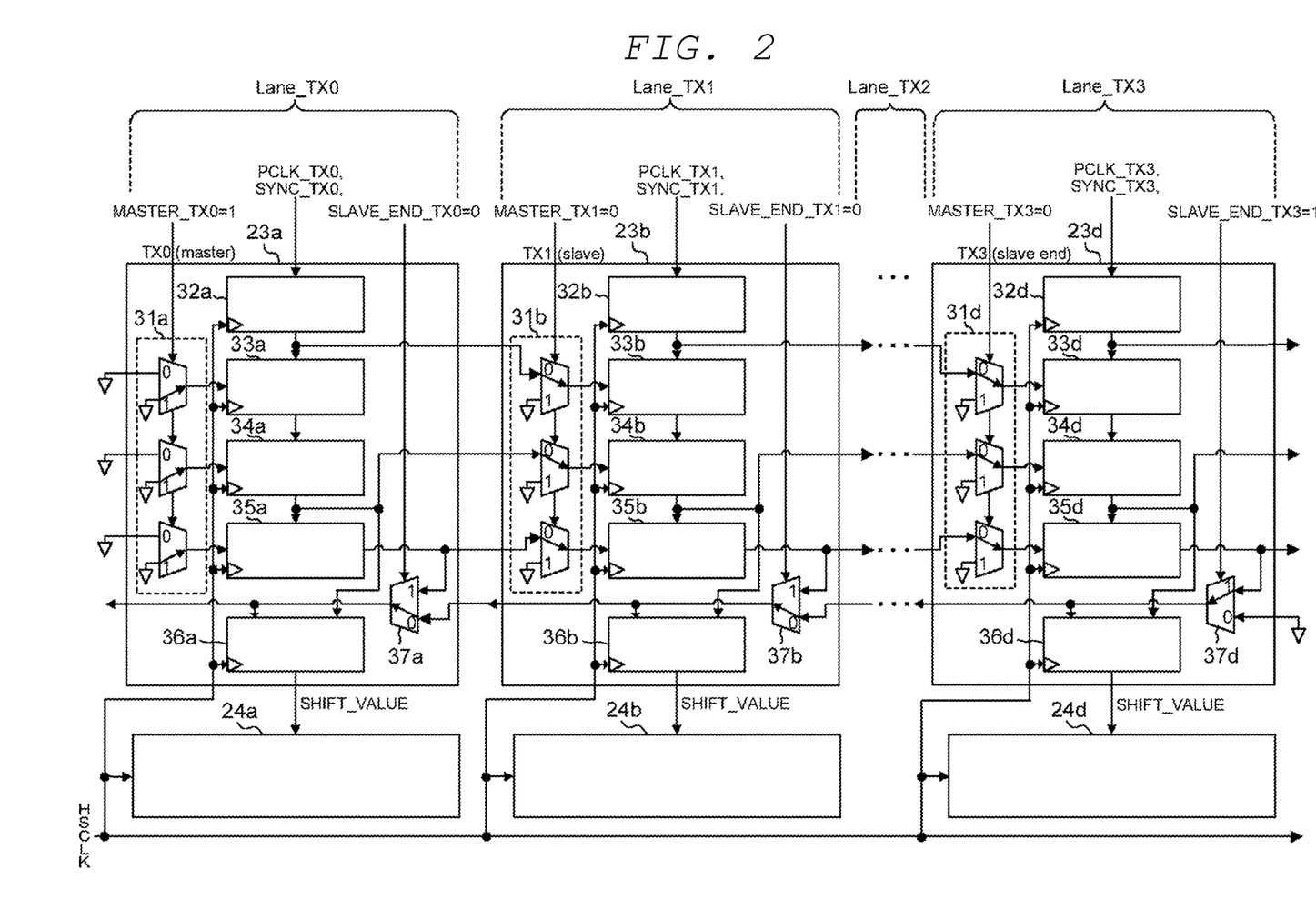
FIG. 2 is a diagram illustrating a schematic configuration of a shift calculation circuit in the data transmission apparatus according to the embodiment.

As illustrated in FIG. 2, Shift Calc 23b includes a PCLK latch circuit (PCLK latch) 32b serving as a first measurement circuit that latches PCLK_TX1 (second clock) and measures a delay amount of PCLK_TX1, an inter-adjacent lane skew measurement circuit (Calc Skew_A) 33b as a second measurement circuit that measures the difference between the delay amount of PCLK_TX1 and the delay amount of adjacent (left adjacent) Lane_TX0, an inter-master lane skew measurement circuit (Calc Skew_M) 34b as a third measurement circuit that measures the difference between the delay amount of PCLK_TX1 and the delay amount of the master lane, a maximum delay amount measurement circuit (Calc Max) 35b as a selection circuit that measures a value of the maximum delay amount in the same link, a shift amount calculation circuit (Calc Shift) 36b as a fourth measurement circuit that calculates the data shift amount of each lane based on the value of the maximum delay amount, and selectors 31b and 37b.

The PCLK Latch 32b latches PCLK_TX1 while SYNC_TX1 is HI. The PCLK Latch 32b latches PCLK_TX1 at a predetermined timing, and measures the delay amount of PCLK_TX1 of Lane_TX1 from the point in time when PCLK_TX1 is latched. The PCLK Latch 32b outputs the measured result (a delay amount).

Calc Skew_A 33b obtains a value (a difference value between the respective delay amounts of adjacent lanes) corresponding to the difference between the delay amount of PCLK_TX1 of Lane_TX1 measured by PCLK Latch 32b and the delay amount of PCLK_TX0 obtained from Lane_TX0 adjacent to Lane_TX1 on the left side.

Specifically, Calc Skew_A 33b receives PCLK_TX1 and SYNC_TX1, and calculates a difference between the delay amount of PCLK_TX0 of the adjacent Lane_TX0 and the delay amount of PCLK_TX1 of own lane (Lane_TX1) using HSCLK. The HSCLK can be a clock signal sufficiently faster than PCLK_TX1. Calc Skew_A 33b calculates the difference as a difference value between the adjacent lane TX0 and the own lane TX1. For example, if PCLK_TX1 is set to 500 MHz, HSCLK is 16 GHz, which is sufficiently faster than PCLK_TX1.

Calc Skew_M 34b obtains a value (difference value between master lanes) corresponding to the difference of the delay amount with the master lane based on the calculated difference value between adjacent lanes and the difference value between adjacent lanes obtained from Lane_TX0 set as the master lane.

Specifically, Calc Skew_M 34b calculates the difference value between the master lane (in this example, Lane_TX0) and the own lane (Lane_TX1 in this example), which can be obtained by adding the difference value corresponding to the own lane to the difference value corresponding to the master lane.

Calc Max 35b selects a large value among the calculated difference value between master lanes of this Lane_TX1 and the difference value between master lanes obtained from the adjacent Lane_TX0 and passes the selected value to the other downstream Lane_TX2 and Lane_TX3 connected in a daisy chain and stores the maximum value returned from Lane_TX2 and Lane_TX3. That is, Calc Max 35b obtains the difference value of lane (that is, lane with the most timing delay with respect to the master lane) of the maximum difference value among the difference values between master lanes measured in each of Lane_TX0 to Lane_TX3.

Calc Shift 36b subtracts the difference value between the master lanes of Lane_TX1 (own lane) from the stored maximum difference value to obtain a shift amount (shift value indicating how many pulses PCLK_TX1 are to be retarded to match the lane with the most timing delay) of the delay amount of PCLK_TX1 of Lane_TX1 (own lane). That is, Calc Shift 36b calculates the shift amount (shift value) for shifting the output timing of PCLK_TX1 of own lane with respect to the maximum difference value.

The selectors 31b and 37b function as setting circuits for setting a range of a target lane for which the delay amount is to be shifted.

The selector 31b is a selection circuit for setting whether Lane_TX1 (own lane) is the master lane or the slave lane and has a control terminal, a plurality of input terminals connected to Shift Calc 23a of Lane_TX0 adjacent on the left, and a plurality of output terminals. The selector 31b switches a lane setting of its own lane to either the master lane or the slave lane according to the input value (MASTER_TX1="1" or "0") input to the control terminal.

For example, when the input value (MASTER_TX1="1") of the master setting is input to the control terminal of the selector 31b, the selector 31b switches the internal switch to the "1" side in order to cause Lane_TX1 (own lane) to function as the master lane and provides the predetermined values to Calc Skew_A 33b, Calc Skew_M 34b, and Calc Max 35b of Lane_TX1 (own lane) through the plurality of output terminals, respectively.

When the input value (MASTER_TX1="0") of the slave setting is input to the control terminal of the selector 31b, the selector 31b switches the internal switch to the "0" side in order to cause Lane_TX1 (own lane) to function as the slave lane and provides information (delay amount, difference value, maximum difference value, and the like) on the clock skew from Shift Calc 23a of Lane_TX0 adjacent to the left and connected to the second input terminal to Calc Skew_A 33b, Calc Skew_M 34b, and Calc Max 35b through the plurality of output terminals.

The selector 37b is a selection circuit for setting whether or not Lane_TX1 (own lane) is a slave Lane at an end, and has a control terminal, a first input terminal, a second input terminal, and an output terminal.

The selector 37b switches the lane setting of its own lane to either the slave lane or the slave end lane according to the input value (SLAVE_END_TX1="1" or "0") input to the control terminal.

For example, when the input value (SLAVE_END_TX1="1") of the slave end lane setting is input to the control terminal, the selector 37b switches to the first input terminal corresponding to the input value "1" in order to cause Lane_TX1 (own lane) to function as the slave end lane. With this configuration, the selector 37b provides the maximum value of the difference value between master lanes from Calc Max 35b connected to the first input terminal to Calc Shift 36b, and also provides the maximum value of the difference value between master lanes to the adjacent Lane_TX0 adjacent on the left via the output terminal.

When an input value (SLAVE_END_TX1="0") that is not set to the slave end lane setting is input to the control terminal, the selector 37b switches to the second input terminal corresponding to the input value "0". With this configuration, the maximum value of the difference value between master lanes reaching the slave end is returned from the downstream lane and notified to the downstream lane.

FIG. 2 illustrates an example in which Lane_TX0 is the master lane and Lane_TX3 is the slave end lane. Accordingly, in Lane_TX0, the selector 31a is set to "1" and the selector 37b is set to "0", in Lane_TX1 and Lane_TX2, the selectors 31b and 31c are set to "0" and the selector 37b is set to "0", and in Lane_TX3, the selector 31d is set to "0" and the selector 37b is set to "1".

By the selector 31 and the selector 37, a range for shifting PCLK_TX1 to PCLK_TX3 between Lane_TX0 set as the master lane among a plurality of lanes and Lane_TX3 set as the slave end lane may be set. In this example, all four lanes are targeted for clock shift.

Figure 3:
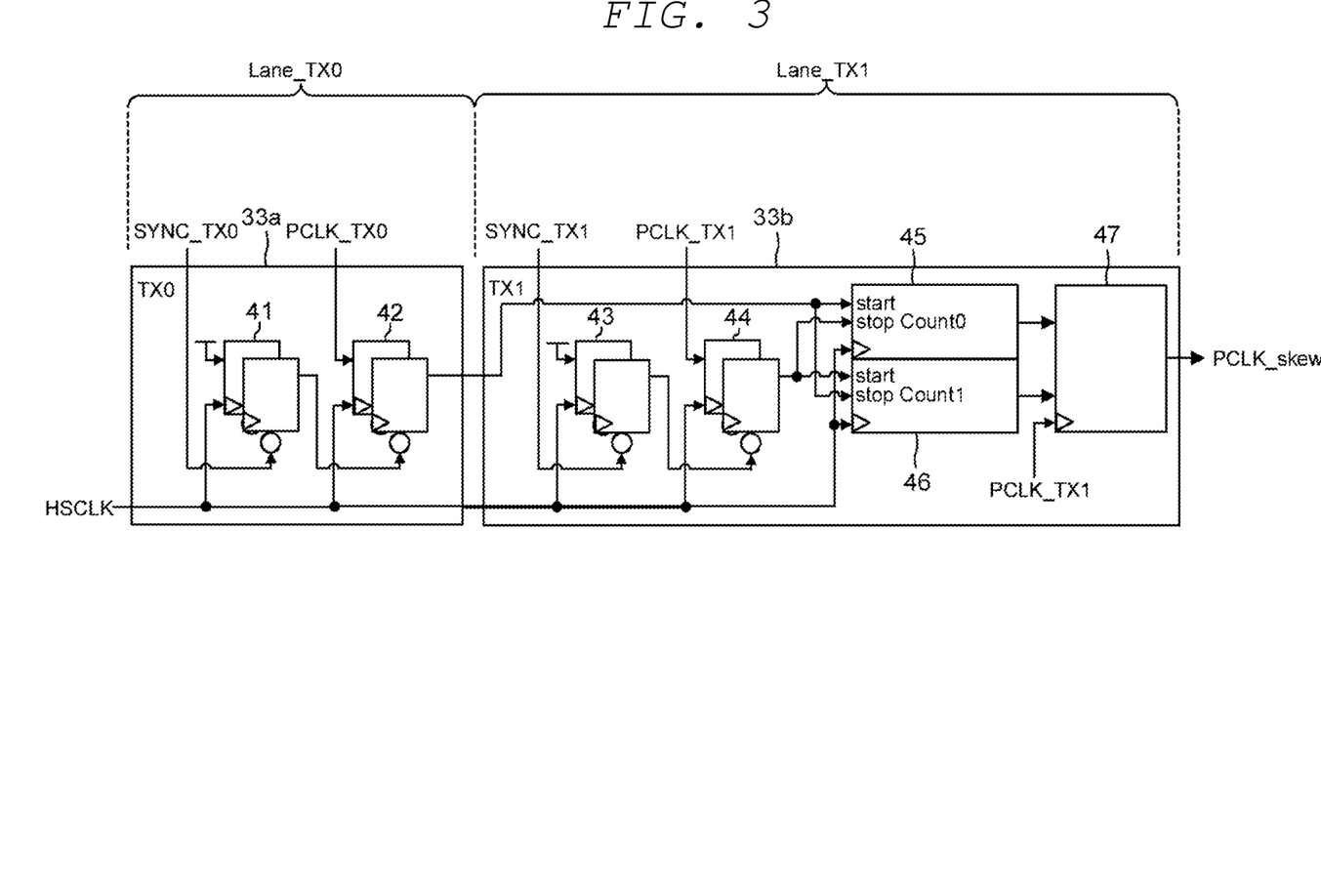
FIG. 3 is a diagram illustrating a configuration of an inter-adjacent lane skew measurement circuit in the shift calculation circuit in the embodiment.

Subsequently, the circuit configuration of Calc Skew_A 33a to 33d will be schematically described with reference to FIG. 3. FIG. 3 illustrates the configuration of Calc Skew_A 33a and 33b in Lane_TX0 and Lane_TX1 as an example. Calc Skew_A 33b determines the amount of skew (how many pulses are drifted) between PCLK of the adjacent Lane_TX 0 and PCLK of own Lane_TX1 and their time direction (minus (fast), plus (slow)) thereof.

Hereinafter, operations of Calc Skew_A 33a and 33b of Lane_TX0 (first lane) and Lane_TX1 (second lane) will be described. In addition, in describing the operations, in order to describe a determination operation of the delay/advance of the clock in one lane of the two lanes, mainly Lane_TX1, a counter circuit on the side of Lane_TX0, a determination circuit, and the like are not specified.

For example, as illustrated in FIG. 3, Calc Skew_A 33a of Lane_TX0 includes a plurality of latch circuits 41 and 42. The latch circuit 41 is reset by SYNC_TX0 based on HSCLK. The latch circuit 42 latches PCLK_TX0 based on HSCLK when the latch circuit 41 is reset by SYNC_TX0.

Calc Skew_A 33b of Lane_TX1 includes a plurality of latch circuits 43 and 44, a plurality of counter circuits 45 and 46, and a determination circuit 47. The latch circuit 43 is reset by SYNC_TX1 based on HSCLK. The latch circuit 44 latches PCLK_TX1 based on HSCLK when the latch circuit 43 is reset by SYNC_TX1.

The counter circuit 45 (Count0) has a start terminal and a stop terminal. The start terminal is connected to an output of the latch circuit 42 of Lane_TX0. The stop terminal is connected to an output of the latch circuit 44 of Lane_TX1.

The counter circuit 45 (Count0) starts counting at the timing when PCLK_TX0 is input to the start terminal from Lane_TX0 (adjacent another lane), ends counting at the timing when PCLK_TX1 of Lane_TX1 (own lane) is input to the stop terminal, and counts the number of cycles (number of pulses) of the clock HSCLK during that time.

The counter circuit 45 (Count0) is a counter for counting that PCLK_TX1 of Lane_TX1 (own lane) is slower than Lane_TX0 (adjacent another lane). The counter circuit 45 (Count0) outputs the counted pulse number (count value) to the determination circuit 47. When the value of this counter is selected, the determination circuit 47 outputs the count value by appending the sign "+" to the count value.

The counter circuit 46 (Count1) has a start terminal and a stop terminal. The start terminal is connected to an output of the latch circuit 44 of Lane_TX1. The stop terminal is connected to an output of the latch circuit 42 of Lane_TX0. The counter circuit 46 (Count1) starts counting at the timing when PCLK_TX1 of Lane_TX1 (own lane) is input to the start terminal, ends counting at the timing when PCLK_TX0 is input to the stop terminal from Lane_TX0 (adjacent another lane), and counts the number of cycles (number of pulses) of the clock HSCLK during that time.

The counter circuit 46 (Count1) is a counter for counting that PCLK_TX1 of Lane_TX1 (own lane) is faster than Lane_TX0 (adjacent another lane). The counter circuit 46 (Count1) outputs the counted pulse number (count value) to the determination circuit 47. When the value of this counter is selected, the determination circuit 47 outputs the count value by appending the sign "−" to the count value.

In response to PCLK_TX1 of Lane_TX1 (own lane) going to HI, the determination circuit 47 selects one of the count values from the magnitude relationship between the count values from the counter circuits 45 and 46 after the reset is released and outputs the selected count value as PCLK skew.

In Lane_TX1, Calc Skew_A 33b latches PCLK by HSCLK (a clock that is fast enough for PCLK), and calculates PCLK Skew for another adjacent Lane_TX0 from the rise edge position of the latched PCLK.

Figure 4:
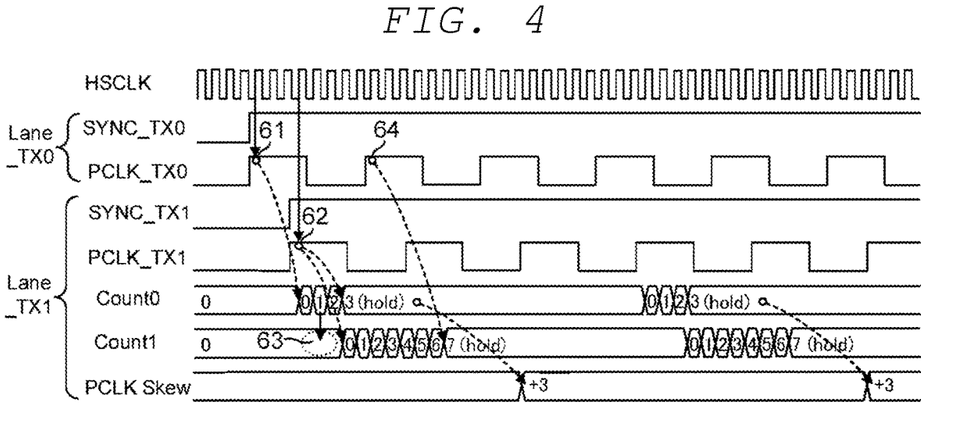
FIG. 4 is a diagram for illustrating an operation when PCLK_TX1 is slower than PCLK_TX0 in the embodiment.

Here, an exemplary operation will be described with reference to FIGS. 4 and 5. For example, as illustrated in FIG. 4, when PCLK_TX1 of Lane_TX1 is slower than PCLK_TX0 of Lane_TX0, in Lane_TX0, at a position 61 immediately after the rise edge of the first PCLK after SYNC_TX0 goes to HI, PCLK_TX0 is latched by HSCLK and the latched signal is input to the start terminal of the counter circuit 45 (Count0). With this configuration, a pulse number (a count of the number of rise edges of HSCLK) by the counter circuit 45 (Count0) is started.

Also, in Lane_TX1, at a position 62 immediately after the rise edge of the first PCLK after SYNC_TX1 goes to HI, PCLK_TX1 is latched by HSCLK, and the latched signal is input to the stop terminal of the counter circuit 45 (Count0) and the start terminal of the counter circuit 46 (Count1).

With this configuration, the pulse number (a count of the number of rise edges of HSCLK) by the counter circuit 45 (Count0) is ended and the pulse number (a count of the number of rise edges of HSCLK) by the counter circuit 46 (Count1) is started.

In this case, delay 63 occurs from the start of counting of the counter circuit 45 (Count0) to the start of counting of the counter circuit 46 (Count1). In the counter circuit 45 (Count0), a count value "3" corresponding to the delay 63 is obtained as the count result.

In Lane_TX0, at a position 64 immediately after the rise edge of the second PCLK after SYNC_TX0 goes to HI, PCLK_TX0 is latched by HSCLK and the latched signal is input to the stop terminal of the counter circuit 46 (Count1).

With this configuration, the pulse number (counting of the number of rising edges of HSCLK) by the counter circuit 46 (Count1) is ended. As a result, in the counter circuit 46 (Count1), a count value "7" is obtained as the count result.

The determination circuit 47 can compare the count value of the counter circuit 45 (Count0) and the counter value of the counter circuit 46 (Count1) at all times and select, as the final count value, the count value of the counter circuit having the larger count value after the release of the reset, of the two counter circuits 45 and 46.

For example, when the counter circuit 45 (Count0) starts and ends counting first after the determination circuit 47 starts operation, the count value of the counter circuit 45 (Count0) is "3" and the count value of the counter circuit 46 (Count1) is "0" and thus, Count0 is larger than Count1. In this case, since PCLK_TX1 results in being later, the determination circuit 47 outputs, as PCLK skew, the sign "+" that selects the counter circuit (Count 0) and "3" that is the value of the counter circuit 45 (Count 0).

Figure 5:
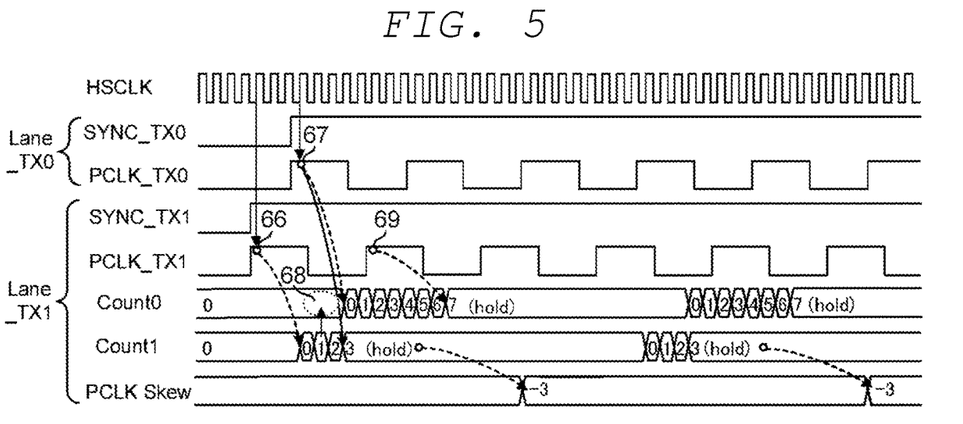
FIG. 5 is a diagram for illustrating an operation when PCLK_TX1 is faster than PCLK_TX0 in the embodiment.

On the other hand, as illustrated in FIG. 5, when PCLK_TX1 of Lane_TX1 is faster than PCLK_TX0 of Lane_TX0, in Lane_TX1, at a position 66 immediately after the rise edge of the first PCLK after SYNC_TX1 goes to HI, PCLK_TX1 is latched by HSCLK and the latched signal is input to the start terminal of the counter circuit 46 (Count1). With this configuration, a pulse number (a count of the number of rise edges of HSCLK) by the counter circuit 46 (Count1) is started.

Also, in Lane_TX0, at a position 67 immediately after the rise edge of the first PCLK after SYNC_TX0 goes to HI, PCLK_TX0 is latched by HSCLK, and the latched signal is input to the stop terminal of the counter circuit 46 (Count1) and the start terminal of the counter circuit 45 (Count0). With this configuration, the pulse number (counting of the number of rise edges of HSCLK) by the counter circuit 46 (Count1) is ended and the pulse number (a count of the number of rise edges of HSCLK) by the counter circuit 45 (Count0) is started.

In this case, delay 68 occurs from the start of counting of the counter circuit 46 (Count1) to the start of counting of the counter circuit 45 (Count0). In the counter circuit 46 (Count1), a count value "3" corresponding to the delay 68 is obtained as the count result.

In Lane_TX1, at a position 69 immediately after the rise edge of the second PCLK after SYNC_TX1 goes to HI, PCLK_TX0 is latched by HSCLK and the latched signal is input to the stop terminal of the counter circuit 46 (Count1). With this configuration, the pulse number (a count of the number of rising edges of HSCLK) by the counter circuit 46 (Count1) is ended. As a result, in the counter circuit 46 (Count1), a count value "7" is obtained as the count result.

The determination circuit 47 always compares the count value of the counter circuit 45 (Count0) and the counter value of the counter circuit 46 (Count1) and selects, as the final count value, the count value of the counter circuit having the larger count value after the release of the reset, of the two counter circuits 45 and 46. The timing for reset release is the timing at which one of both counter circuits 45 and 46, which is on a slower side, starts counting.

For example, when the counter circuit 46 (Count1) starts and ends counting first after the determination circuit 47 starts operation, the count value of the counter circuit 46 (Count1) is "3" and the count value of the counter circuit 45 (Count0) is "0" and thus, Count0 is smaller than Count1. In this case, since PCLK_TX1 results in being faster, the determination circuit 47 outputs, as PCLK skew, the sign "−" that selects the counter circuit 46 (Count1) and "3" that is the value of the counter circuit 46 (Count1).

Next, the circuit configuration of Data Shifts 24a to 24d will be described with reference to FIG. 6. Since all of these circuits have the same configuration, Data Shift 24a will be described.

Figure 6:
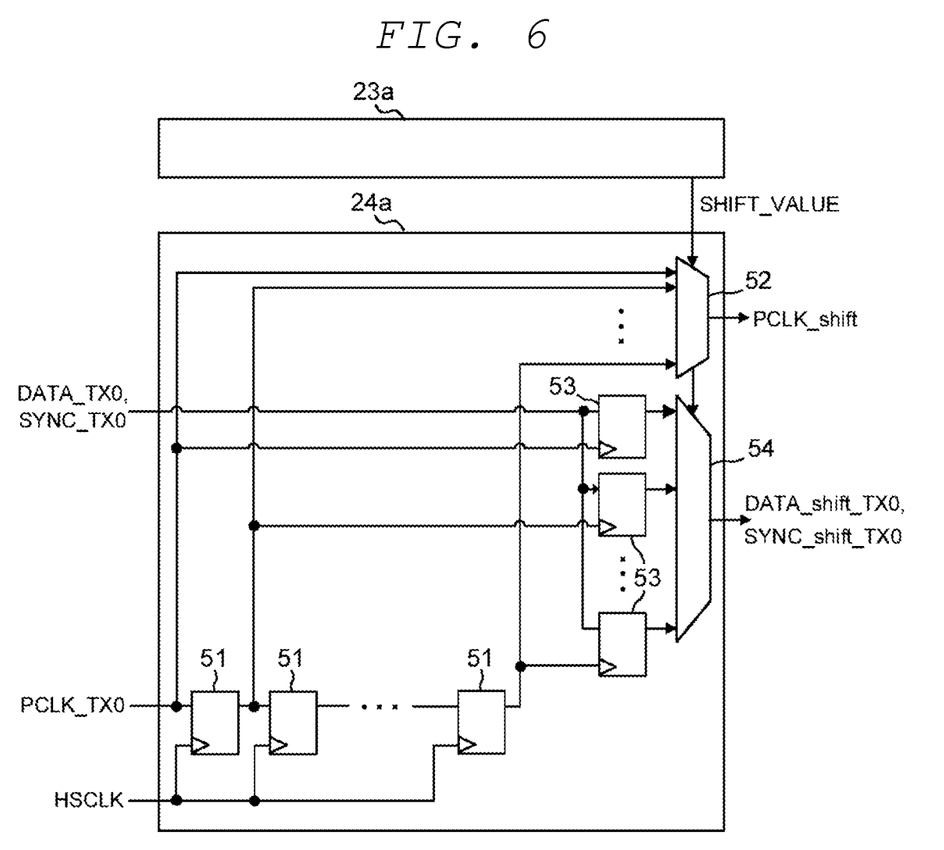
FIG. 6 is a diagram illustrating a schematic configuration of a data shift circuit in the embodiment.

As illustrated in FIG. 6, Data Shift 24a includes a plurality of shift registers 51 for latching PCLK_TX0 with HSCLK, a selector 52 for selecting and outputting a clock signal output from each shift register 51 according to the value of the shift amount input from Shift Calc 23a, a plurality of shift registers 53 for latching the input DATA_TX0 and SYNC_TX0, and a selector 54 for selecting and outputting the data DATA_TX0 and SYNC_TX0 output from each shift register 53 according to the value of the shift amount input from Shift Calc 23a.

That is, Data Shift 24a outputs PCLK_TX0, DATA_TX0, and SYNC_TX0 shifted in synchronization with HSCLK based on the shift amount calculated by Shift Calc 23a.

Hereinafter, the operation of the data transmission apparatus according to the embodiment will be described with reference to FIGS. 1 and 7 to 9.

As illustrated in FIG. 1, in the data transmission apparatus according to the embodiment, PCLK_source output from the COM 21 is branched and supplied to the frequency divider circuits 11a to 11d of the respective lanes. In the frequency divider circuit 11a, PCLK_TX0 is generated from the input PCLK_source and is output to the parallel-to-serial conversion circuit 22a. Besides, SYNC_TX0 and DATA_TX0 are output from the frequency divider circuit 11a to the parallel-to-serial conversion circuit 22a.

Similarly, in the frequency divider circuit 11b, PCLK_TX1 is generated from the branched and input PCLK_source and is output to the parallel-to-serial conversion circuit 22b. Besides, SYNC_TX1 and DATA_TX1 are output from the frequency divider circuit 11b to the parallel-to-serial conversion circuit 22b. The other frequency divider circuits 11c and 11d are also the same.

Here, it is assumed that by terminal settings of the parallel-to-serial conversion circuits 22a to 22d, the parallel-to-serial conversion circuit 22a is set as the master lane in advance, the parallel-to-serial conversion circuits 22b to 22d are set as the slave lanes in advance, and the parallel-to-serial conversion circuit 22d is set as the slave end lane among them.

Figure 7:
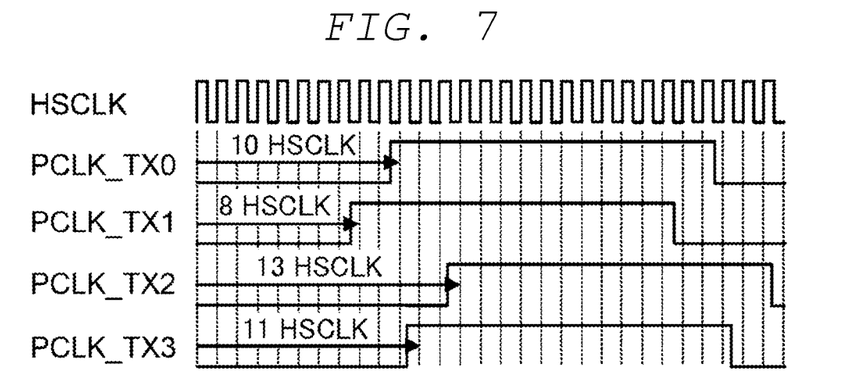
FIG. 7 is a diagram illustrating a state in which clock skew occurs between lanes in the embodiment.

The clock skew illustrated in FIG. 7 occurs between PCLK_TX0 to PCLK_TX3, which are inputs to the parallel-to-serial conversion circuits 22a to 22d, respectively.

As illustrated in FIG. 7, it is assumed that, with respect to the high-speed HSCLK, PCLK_TX0 is retarded by 10 HSCLK (10 pulses), PCLK_TX1 is retarded by 8 HSCLK (8 pulses), PCLK_TX2 is retarded by 13 HSCLK (13 pulses), PCLK_TX3 is retarded by 11 HSCLK (11 pulses), and clock skew between lanes occurs. One pulse of HSCLK is also referred to as a HSCLK cycle number.

Figure 8:
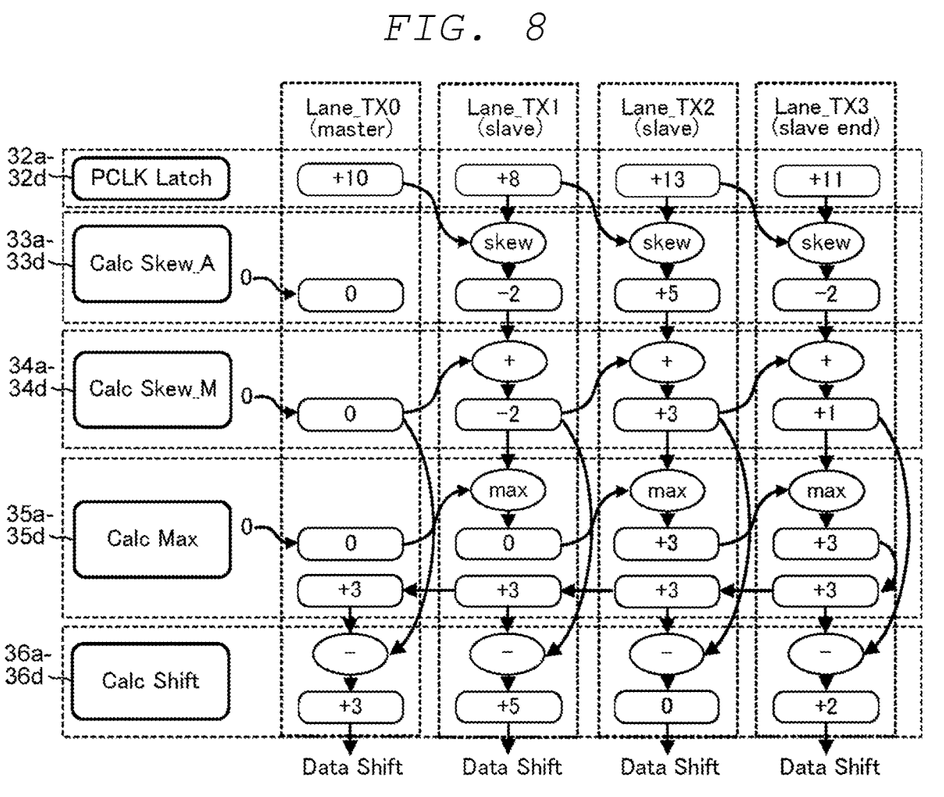
FIG. 8 is a diagram for illustrating an operation of each component of the shift calculation circuit in the embodiment.

In this case, when PCLK_TX0 to PCLK_TX3 are input to Shift Calc 23a to 23d, in Lane_TX0, PCLK Latch 32a measures+10 as the delay amount of PCLK_TX0 as illustrated in FIG. 8. In Lane_TX1, PCLK Latch 32b measures+8 as the delay amount of PCLK_TX1. In Lane_TX2, PCLK Latch 32c measures+13 as the delay amount of PCLK_TX2. In Lane_TX3, PCLK Latch 32d measures+11 as the delay amount of PCLK_TX3.

Next, in each lane, the difference value between adjacent lanes with the lane adjacent to the left is measured by Calc skew_A 33a to A33d. Since Lane_TX0 is set as the master lane, "0" is set to the difference value between adjacent lanes, the difference value between master lanes, and the maximum difference value, and skew between lanes is not measured.

In Lane_TX1, Calc skew_A 33b calculates a difference between the difference value "+10" between adjacent lanes obtained from Lane_TX0 and the difference value "+8" between adjacent lanes measured by Lane_TX1 of its own. In this case, if "+10" is subtracted from "+8", "−2" is obtained, and this value is taken as the difference value between adjacent lanes of Lane_TX1. Similarly for the other lanes, the difference value between adjacent lanes of Lane_TX2 is "+5", and the difference value between adjacent lanes of Lane_TX3 is "−2".

Next, in Lane_TX1, Calc skew_M 34b calculates the difference value between master lanes by adding the difference value "0" between adjacent lanes obtained through a signal line (see the circuit of FIG. 2) connected to Calc skew_M 34a of Lane_TX0 which is the master lane and the difference value "−2" between adjacent lanes calculated at Lane_TX1 of its own.

In this case, the difference value between master lanes is "−2" obtained by adding "0" and "−2". Similarly for other lanes, the difference value between master lanes of Lane_TX2 is taken as "+3" and the difference value between master lanes of Lane_TX3 is taken as "+1".

Next, in Lane_TX1, Calc Max 35b compares the maximum difference value "0" obtained from Lane_TX0 with the difference value "−2" between master lanes calculated at Lane_TX1 of its own, and sets the larger value as the maximum difference value. In this case, as a result of comparing "0" and "−2", the larger value becomes "0", and this value is taken as the maximum difference value between lanes of Lane_TX0 and Lane_TX1.

Similarly, the maximum difference value is calculated for the other lanes, the maximum difference value between lanes of Lane_TX1 and Lane_TX2 is taken as "+3" in Lane_TX2, the maximum difference value between lanes of Lane_TX2 and Lane_TX3 is taken as "+3" in Lane_TX3, and this maximum difference value "+3" is sequentially returned (notified) from Lane_TX3 which is the slave end lane to Lane_TX2, Lane_TX1, and Lane_TX0, and is stored in each lane.

Finally, in Lane_TX1, Calc Shift 36b subtracts the difference value between master lanes of its own from the stored maximum difference value "+3" to calculate the shift value (how many pulses is retarded from the value of the delay amount of own lane) of PCLK_TX1.

In this case, the result of subtracting "−2" from "+3" (result of taking the difference between each other) becomes "+5", and this value is taken as the shift value of PCLK_TX1. Similarly, for the other lanes, the shift value of PCLK_TX2 in Lane_TX2 is "0", and the shift value of PCLK_TX3 in Lane_TX3 is "+2". Here, the shift value is also calculated for Lane_TX0 which is the master lane, and as a result of subtracting "0" from "+3", the shift value of PCLK_TX0 becomes "+3".

In this way, since shift values are output from Shift Calc 23a to 23d of each lane to Data Shift 24a to 24d, respectively, Data Shift 24a to 24d of each lane shift PCLK_TX0 to PCLK_TX3 according to their shift values (delay to match the slowest PCLK_TX2), respectively.

Figure 9:
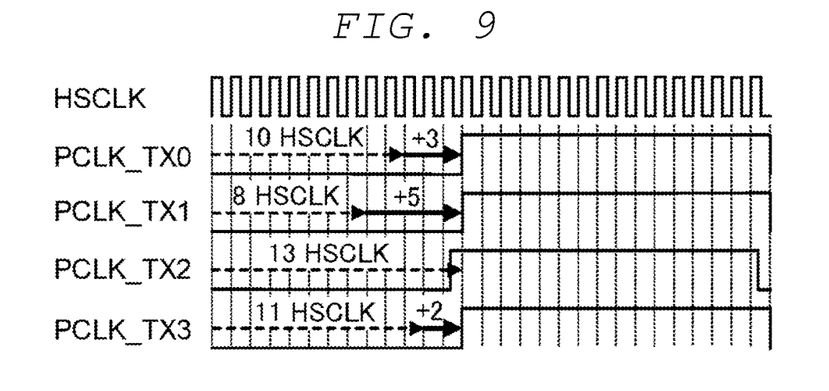
FIG. 9 is a diagram illustrating a state in which the clock skew between lanes is reduced in the embodiment.

Specifically, as illustrated in FIG. 9, Data Shift 24a latches PCLK_TX0 by delaying three pulses (+3) from the timing (end position of the broken line arrow) of the delay amount of own Lane_TX0. Data Shift 24b latches PCLK_TX1 by delaying five pulses (+5) from the timing of the delay amount of own Lane_TX1. Since the delay amount of own Lane_TX2 is "+13" and is the slowest, Data Shift 24c latches at the timing when the pulse of PCLK_TX2 rises next. Data Shift 24d latches PCLK_TX3 by delaying two pulses (+2) from the timing of the delay amount of own Lane_TX3.

The effects of the data transmission apparatus of the embodiment will be described with reference to FIG. 10.

For example, as illustrated in FIG. 7, the delay amount (skew of PCLK_TX1) of Lane_TX1 is "+8" and the delay amount (skew of PCLK_TX2) of the slowest Lane_TX2 is "+13".

Figure 10:
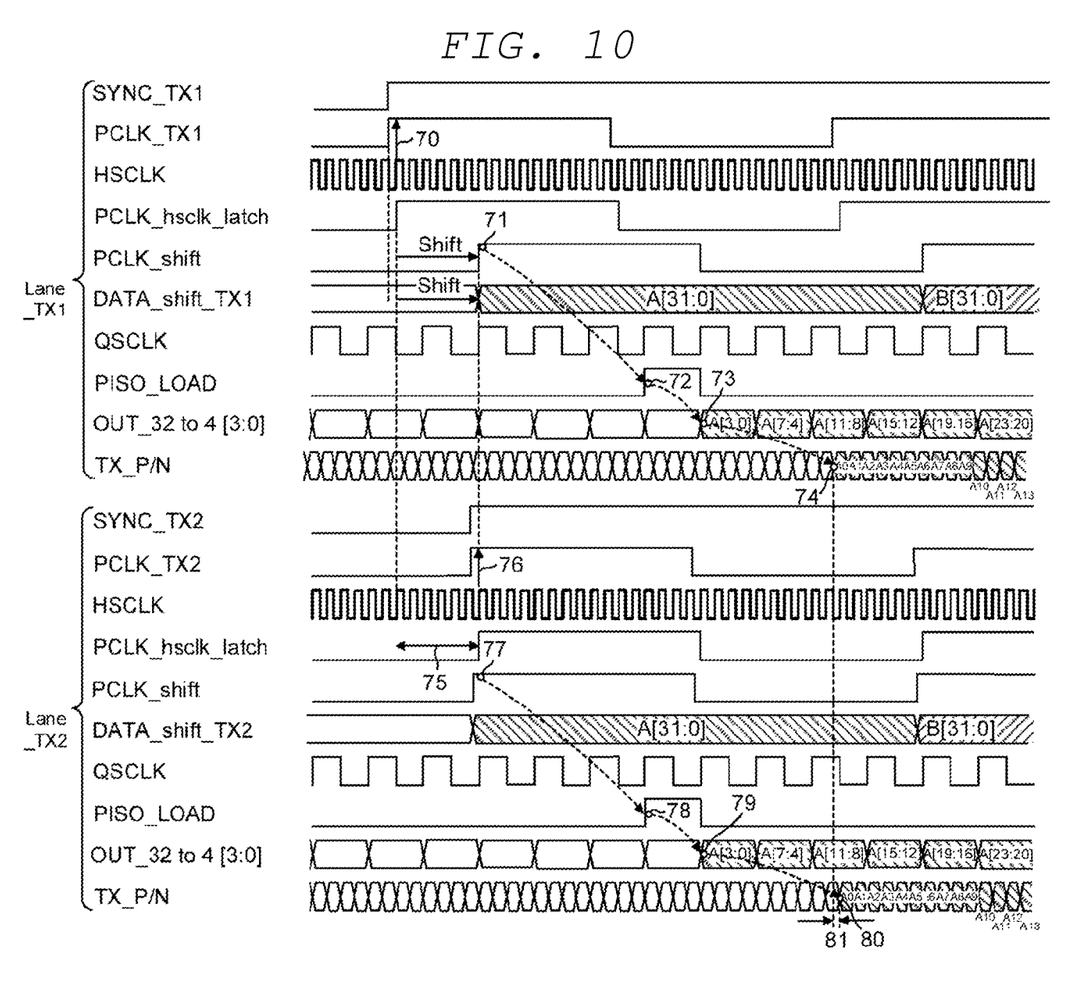
FIG. 10 is a diagram for illustrating the effect of the data transmission apparatus according to the embodiment.

In this case, as illustrated in FIG. 10, when PCLK_TX1 is latched by HSCLK at timing 70 in Lane_TX1, PCLK_hsclk_latch is obtained. In contrast, in the embodiment, since Data Shift 24b latches PCLK_TX1 by shifting 5 pulses of HSCLK according to the shift value "+5" input from Shift Calc 23b, PCLK_shift in which PCLK_TX1 is latched is obtained at timing 71, and PCLK_shift, SYNC_TX1, and DATA shift TX1 are input to the PISO_LOAD 26b.

PISO_LOAD 26b outputs the PISO_Load signal to the PISO_n_to_4 27b at timing 72 and DATA shift TX1 is converted into 4-bit parallel data at timing 73 and is sequentially output from the PISO_n_to_4 27b to the PISO_4_to_1 29b. In the PISO_4_to_1 29b, the input 4-bit parallel data OUT_32_to_4[3:0] is converted into 1-bit serial data, and is sequentially output from the output circuit 30b at timing 74.

On the other hand, in Lane_TX2, PCLK_TX2 is latched by HSCLK at timing 76, at which PCLK_TX2 is delayed by the same amount as PCLK_TX1 is shifted (interval of 5 pulses of 75) in Lane_TX1, and PCLK_hsclk_latch is obtained. This PCLK_hsclk_latch is a signal that transitions at the same timing as PCLK_shift of Lane_TX1. PCLK_TX2 of Lane_TX2 is not shifted because it is the slowest PLCK among Lane_TX0 to Lane_TX3, and PCLK_TX2 itself is output to PISO_LOAD 26c as PCLK_shift.

PISO_LOAD 26c outputs the PISO_Load signal to the PISO_n_to_4 27c at timing 78 and DATA shift TX2 is converted into 4-bit parallel data at timing 79 and is sequentially output from the PISO_n_to_4 27c to the PISO_4_to_1 29c. In the PISO_4_to_1 29c, the input 4-bit parallel data OUT_32_to_4[3:0] is converted into 1-bit serial data, and is sequentially output from the output circuit 30c at timing 80.

As a result, a slight time difference 81 of less than one pulse occurs between the timing 80 in Lane_TX2 and the timing 74 in Lane_TX1. However, this is an analog skew, which inevitably occurs due to a circuit structure and thus, it is sufficiently acceptable as skew between lanes.

As described above, according to the data transmission apparatus of the present embodiment, in configuring a link with a plurality of Lane_TX0 to Lane_TX3 and transmitting data using PCLK for each lane, skew reduction can be achieved by eliminating the influence of skew between lanes that occurs on PCLK_TX0 to PCLK_TX3 (clocks for parallel data) output from the frequency divider circuits 11a to 11d provided for each lane. With this configuration, for example, an output per link in data transmission using the bifurcation function of performing communication at different data rates per link can be made to cope with the increase in SPEC.

Other Embodiments

Figure 11:
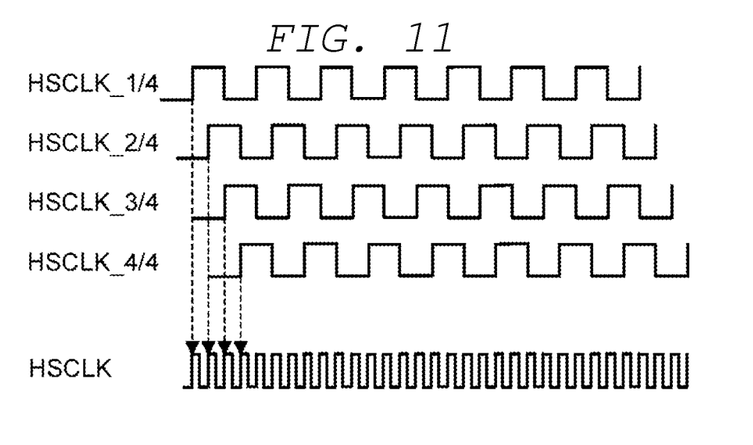
FIG. 11 is a diagram illustrating an example for obtaining HSCLK timing in another embodiment.

In the embodiment described above, HSCLK which is sufficiently faster than PCLK_TX1 is used, but HSCLK may be too fast and timing design may be difficult. In such a case, as illustrated in FIG. 11, skew can be adjusted with the same resolution as HSCLK by using a plurality of frequency-divided clocks PCLK_1/4 to PCLK_4/4 (multi-phase clocks) (multi-phase clocks of different phases) each having a phase that is changed by 90 degrees in synchronization with each edge of HSCLK, for example, each of which has a frequency of one-fourth (four times period) that of HSCLK. The multi-phase of four-phase clock illustrated here is an example, and may be other than this example, and the embodiment is not limited to the number of phases.

The shift calculation circuit (Shift Calc) is disposed in each lane in the embodiment described above. In the case of a 2-lane configuration as a minimum configuration, the shift calculation circuit (Shift Calc) may be disposed in at least one of the two lanes. The data shift circuit (Data Shift) may be disposed in the lane to be shifted.

The first lane of four lanes is the master lane and the last lane is the slave end lane in the embodiment described above. When the number of lanes and the number of links are large, it is possible to cope with various lane configurations such as bifurcation and aggregation by limiting the target lanes for which clock shift is to be performed among a plurality of lanes connected in a daisy chain and setting a master lane and a slave end lane in the range of the target lanes.

All of the plurality of lanes are set as the shift targets in the embodiment described above. Alternatively, only some of the lanes may be set as the shift targets. In this case, one lane of the plurality of lanes set as the shift targets may be set as the master lane, and the end lane that is connected in a daisy chain from the master lane may be set as the slave end lane, and the frequency-divided clock may be shifted between the master lane and the slave end lane.

The PCI Express interface device is described in the embodiment described above. In addition to this, the embodiment can apply to any device, for example, accelerated graphics port (AGP), SATA, M.2, and the like, having plural lanes and using a frequency-divided clock different for each lane when converting parallel data into serial data.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A data transmission apparatus comprising:
a plurality of lanes each providing a transmission path;
a first clock generation circuit configured to generate a first clock as a reference for data transmission in a first lane of the plurality of lanes;
a second clock generation circuit configured to generate a second clock as a reference for data transmission in a second lane of the plurality of lanes, the first and second lanes configured to constitute a part of a link as a unit of data transmission;
a first circuit configured to determine a shift amount by notification of a first delay amount of the first lane and a second delay amount of the second lane to cause a delay amount of one of the first clock and the second clock to match a delay amount of the other of the first clock and the second clock; and
a second circuit configured to shift the first delay amount or the second delay amount based on the determined shift amount; wherein
the first circuit includes:
a first measurement circuit configured to latch a clock input to a third lane of the plurality of lanes at a prescribed timing and measure a delay amount of the third lane based on a timing of the latching;
a second measurement circuit configured to calculate a first difference value between the delay amount of the third lane and a delay amount obtained from a fourth lane of the plurality of lanes adjacent to the third lane;
a third measurement circuit configured to calculate a second difference value by adding the first difference value and a difference value corresponding to a lane of the plurality of lanes set as a master lane;
a selection circuit configured to select a greater value between the second difference value and other difference values calculated in other lanes, deliver the selected value to a fourth lane of the plurality of lanes adjacent the third lane, and store the selected value; and
a fourth measurement circuit configured to obtain a shift amount corresponding to the third lane by subtracting the second difference value from the selected value.

2. The data transmission apparatus according to claim 1, wherein
the first circuit is further configured to determine the shift amount so as to match the first delay amount or the second delay amount based on a delay having a later timing.

3. The data transmission apparatus according to claim 1, further comprising;
a conversion circuit configured to convert parallel data read at a timing of the clock input shifted by the second circuit into serial data.

4. The data transmission apparatus according to claim 1, further comprising;
a setting circuit configured to set a range of target lanes for which the delay amount is to be shifted.

5. A data transmission method, comprising:
generating a first clock as a reference for data transmission in a first lane of a plurality of lanes, each of the plurality of lanes providing a transmission path;
generating a second clock as a reference for data transmission in a second lane of the plurality of lanes, the first and second lanes configured to constitute a link as a unit of data transmission;
determining a shift amount by notification of a first delay amount of the first lane and a second delay amount of the second lane to cause a delay amount of one of the first clock and the second clock to match a delay amount of the other of the first clock and the second clock;
shifting the first delay amount or the second delay amount based on the determined shift amount;
determining a first difference value between the first delay amount and the second delay amount; and
determining a second difference value by adding a difference value corresponding to the first lane and the first difference value, wherein the first lane is a master lane.

6. The data transmission method of claim 5, further comprising:
selecting a greater value between the second difference value and the difference value corresponding to the first lane.

7. The data transmission method of claim 6, further comprising:
delivering the selected value to a third lane of the plurality of lanes adjacent the second lane; and
storing the selected value.

8. The data transmission method of claim 7, further comprising:
determining the shift amount by subtracting the second difference value from the selected value.

9. A data transmission apparatus comprising:
a master lane, a slave lane, and a slave end lane, the master, slave, and slave end lanes configured to constitute a link as a unit of data transmission and comprises, respectively;
a first measurement circuit configured to measure a first delay amount of a first clock corresponding to the master lane, a second delay amount of a second clock corresponding to the slave lane, and a third delay amount of a third clock corresponding to the slave end lane;
a second measurement circuit configured to determine, for the master lane, a first reference difference value, and calculate, for the slave lane, a first difference value between the first delay amount of the master lane and the second delay amount of the slave lane and, for the slave end lane, a second difference value between the second delay amount of the slave lane and the third delay amount of the slave end lane;
a third measurement circuit configured to calculate, for the slave lane, a third difference value by adding the first difference value and the first reference difference value and, for the slave end lane, a fourth difference value by adding the second difference value and the third difference value;
a selection circuit configured to select, for the slave lane, a first greater value between a second reference difference value and the third difference value and, for the slave end lane, a second greater value between the fourth difference value and the first greater value, and store the selected second greater value, and
a fourth measurement circuit configured to obtain, for the master lane, a first shift amount by subtracting the second reference difference value from the selected second greater value, for the slave lane, a second shift amount by subtracting the third difference value from the selected second greater value and, for the slave end lane, a third shift amount by subtracting the fourth difference value from the selected second greater value.

\* \* \* \* \*